United States Patent
Wong et al.

(10) Patent No.: US 6,840,428 B2
(45) Date of Patent: Jan. 11, 2005

(54) SELF-ADHESIVE FLEXIBLE REPAIR CIRCUIT

(75) Inventors: Marvin G Wong, Woodland Park, CO (US); Albert A Yeh, Colorado Springs, CO (US); Barry Welsh, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/368,918

(22) Filed: Feb. 19, 2003

(65) Prior Publication Data

US 2003/0121953 A1 Jul. 3, 2003

Related U.S. Application Data

(62) Division of application No. 09/943,282, filed on Aug. 30, 2001.

(51) Int. Cl.[7] .......................... H05K 1/03; H01R 12/00
(52) U.S. Cl. .................... 228/119; 29/402.09; 174/255; 361/749; 439/67
(58) Field of Search ................................ 228/119, 191, 228/264; 29/829, 846, 854, 402.01, 402.09; 174/254, 255; 361/749; 439/67; 428/344

(56) References Cited

U.S. PATENT DOCUMENTS

| | | | | |
|---|---|---|---|---|
| 4,438,561 A | * | 3/1984 | Mueller | 29/831 |
| 4,806,106 A | * | 2/1989 | Mebane et al. | 439/77 |
| 5,214,250 A | * | 5/1993 | Cayson et al. | 174/250 |
| 6,274,819 B1 | * | 8/2001 | Li et al. | 174/254 |
| 6,601,292 B2 | * | 8/2003 | Li et al. | 29/829 |
| 2001/0035301 A1 | * | 11/2001 | Li et al. | 174/261 |
| 2003/0042295 A1 | * | 3/2003 | Wong et al. | 228/119 |
| 2003/0121953 A1 | * | 7/2003 | Wong et al. | 228/180.21 |
| 2003/0146018 A1 | * | 8/2003 | Sinkunas et al. | 174/254 |

FOREIGN PATENT DOCUMENTS

WO    WO 01/17321 A1 *  3/2001

OTHER PUBLICATIONS

IBM Technical Disclosure Bulletin NN9504479 (Apr. 1, 1995).*
IBM Technical Disclosure Bulletin NA9008213 (Apr. 1, 1995).*

* cited by examiner

Primary Examiner—Kiley S. Stoner
(74) Attorney, Agent, or Firm—Regan L. Trumper

(57) ABSTRACT

A self-adhesive flexible circuit for printed circuit assembly repair is provided. The flexible circuit comprises a carrier film, a circuit trace and an adhesive. The flexible circuit is placeable on a printed circuit board having a circuit assembly and allows simple repair of boards not designed or manufactured correctly and which contain undesirable short or open circuits or misrouted traces. The flexible circuit allows for placement in a desired location, adherence to the circuit board using its own adhesive. The flexible circuit can then be electrically attached, i.e. solder or conductively adhered, to the board.

5 Claims, 4 Drawing Sheets

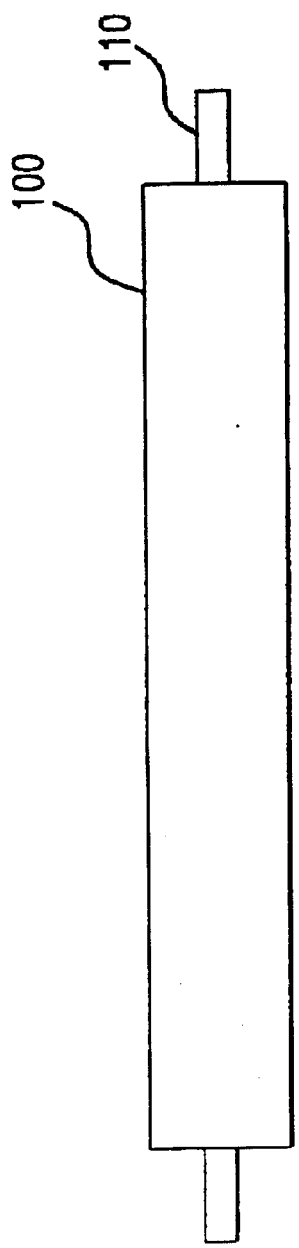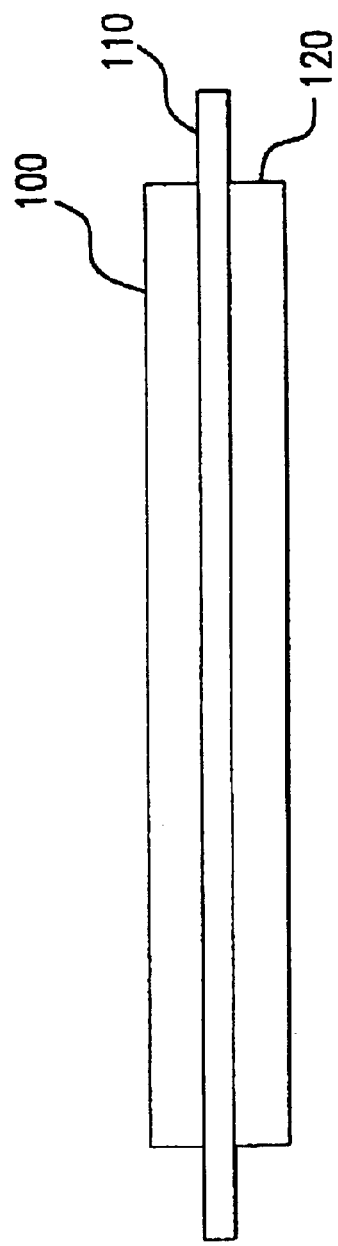

SELF-ADHESIVE FLEXIBLE REPAIR CIRCUIT

This is a Divisional of copending application Ser. No. 09/943,282, filed on Aug. 30, 2001, the entire disclosure of which is incorporate herein by reference.

BACKGROUND

This invention is concerned generally with printed circuit assemblies, and more specifically with repair of printed circuit assemblies.

Often, circuit boards or assemblies have systematic defects, such as when the boards or assemblies are not designed or manufactured correctly. Incorrectly designed boards or assemblies may contain undesirable short circuits, open circuits or misrouted traces. It is normal industry practice to install jumper wires and have traces cut as appropriate to correct the defects in the boards or assemblies. If the boards or assemblies are low cost or if repair of the boards or assemblies proves to be too difficult, the boards are often scrapped and replaced. However, when the boards or assemblies are expensive or other circumstances exist that prevent scrapping, the boards or assemblies need to be repaired. When repair is required for a defective group of boards or assemblies, there are often hundreds or thousands of boards needing attention. In such circumstances, it is advantageous to have the repair process and mechanisms as simple, repeatable and robust as possible. This is especially true if the repair is difficult, such as rerouting electrical signals under a ball grid array (BGA) component.

SUMMARY

The present invention provides a flexible circuit useful for printed circuit assembly repair. When repair of a printed circuit assembly is difficult due to space constraints, such as under BGA's, and there are a multitude of identical defects requiring repair, the invention provides a self-adhesive flexible circuit ("flex circuit") for new routing of the electrical signals.

The flexible circuit of the invention provides mechanical stability in the plane which prevents the circuit from disturbing adjacent solder joints or components. It also provides a thin, small thickness, construction for assembly under low standoff components. Use prior to normal surface mount processes is also possible. A self-adhesive property of the flexible circuit eliminates misalignment between wire routing and "tacking" in place before the adhesive sets.

A method of using a flexible circuit of the invention comprises putting the flex circuit into place, adhering to the printed circuit assembly using the adhesive of the flex circuit and electrically connecting the flex circuit to the printed circuit assembly.

DESCRIPTION OF THE DRAWINGS

The invention can be better understood with reference to the following drawings. The components in the drawings are not necessarily to scale, emphasis instead being placed upon clearly illustrating the principles of the present invention.

FIG. 1 is a top view of a self-adhesive flex circuit according to the invention.

FIG. 2 is a side view of a self-adhesive flex circuit according to the invention.

DETAILED DESCRIPTION OF THE INVENTION

Turning to FIG. 1, shown is a top view of a self-adhesive flex circuit according to the invention. A carrier film 100 is employed to be the top level of the flex circuit. A preferred carrier film is Kapton. A circuit trace 110 runs under the carrier film 100. The circuit trace 110 extends the length of the carrier film. For the purposes of the example shown in FIG. 1, a single circuit trace is shown in accordance with the invention. It is understood by those skilled in the art that a plurality of circuit traces is possible. Accordingly, two or more circuit traces can extend from one or both ends of the carrier film.

FIG. 2 shows a side view of a self-adhesive flex circuit according to the invention. This self-adhesive flex circuit is the same circuit as that shown in FIG. 1. The carrier film 100 is the top layer of the circuit. Directly below the carrier film 100 is the circuit trace 110. As seen in FIG. 2, the circuit trace extends the length of the carrier film and extends beyond each end. Only one circuit trace is shown in FIG. 2, but it is understood by those in the art that a plurality of circuit traces can be used. Any additional circuit traces would be parallel with the shown circuit trace 110 and would be on the same plane, into the figure. An adhesive 120 is shown directly below the circuit trace 110. In a preferred embodiment of the invention, the adhesive is a pressure sensitive adhesive. In a more preferred embodiment, the pressure sensitive adhesive is 3M VHB adhesive.

Figure 3:
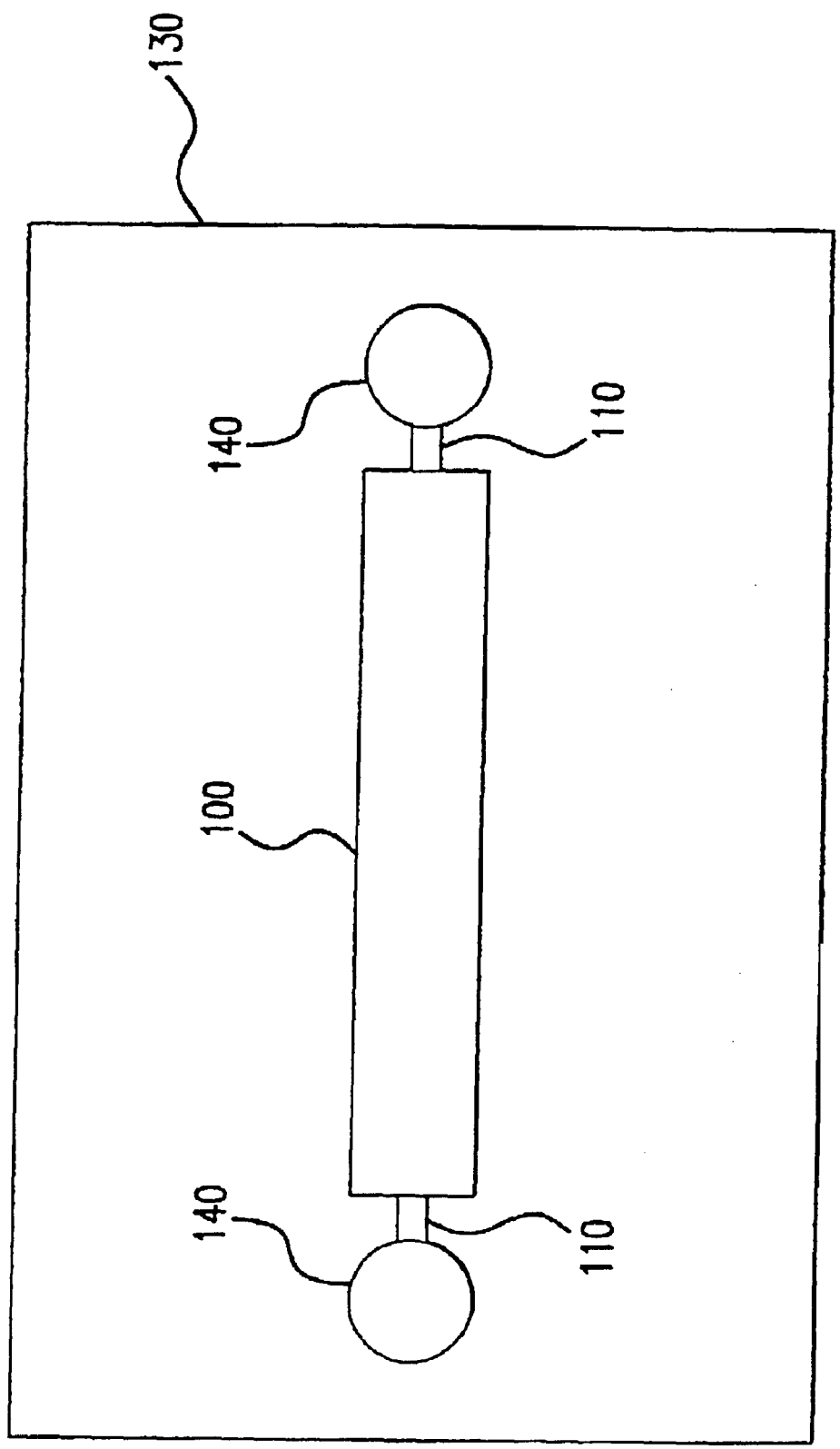
FIG. 3 is a top view of an example use of a self-adhesive flex circuit according to the invention.

FIG. 3 shows a top view of an example use of a self-adhesive flex circuit according to the invention. A circuit board 130 is generically shown. The circuit board 130 underlies the circuit trace 110 and the carrier film 100. Each end of the circuit trace 110 is attached to the circuit board 130 by an electrical attachment 140. Preferably, the attachment is a solder attachment. In an other embodiment of the invention, the attachment is an electrically conductive adhesive.

Figure 4:
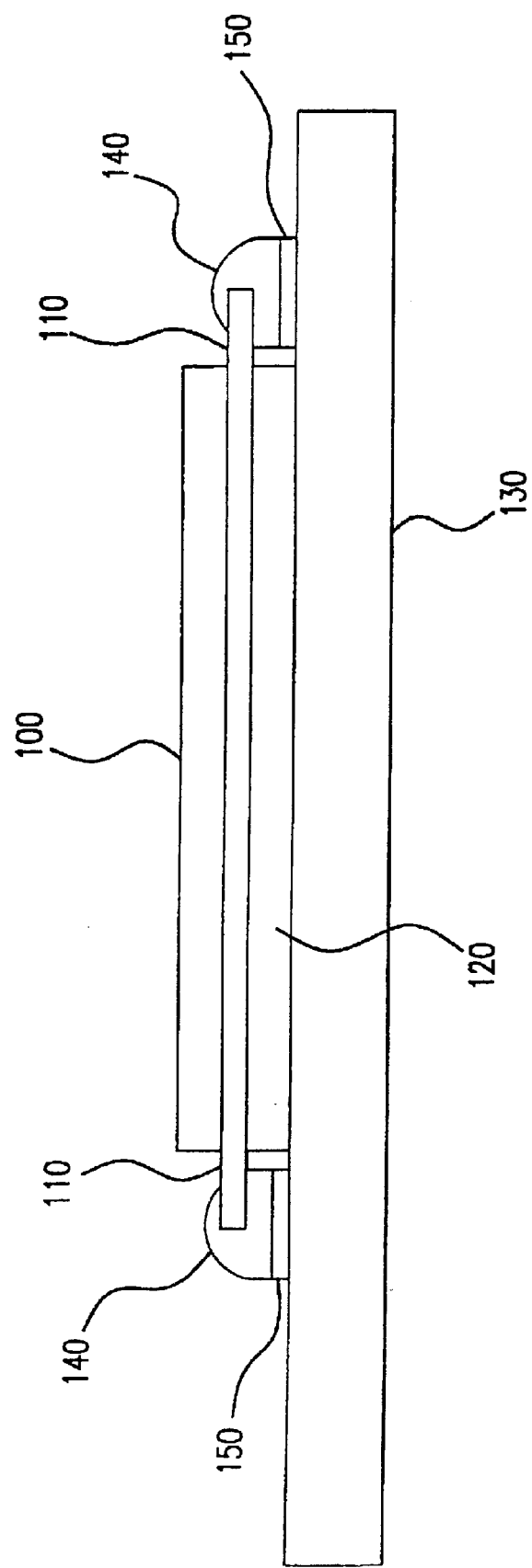
FIG. 4 is a side view of an example use of a self-adhesive flex circuit according to the invention.

FIG. 4 shows a side view of the example use of a self-adhesive flex circuit according to the invention. The carrier film 100 is the top layer of the flex circuit. As can be seen, the circuit trace 110 extends beyond the ends of the carrier film so that the attachment 140 connects with the circuit trace without interfering with the carrier film 100. The adhesive 120 non-electrically connects the circuit trace 110 to the generically shown circuit board. The attachments 140 electrically connect the circuit trace to an electrical pad 150. The electrical pad 150 provides access a circuit (not shown) on the circuit board 130.

The self-adhesive repair flex circuit of the invention may contain a plurality of circuit traces as discussed and may additionally have a complex shape comprising holes. The holes may provide clearance from other components or assembly features. A flex circuit of the invention may also be used to reroute circuits that contain attachment pads for BGA components. If the BGAs and other circuit elements are suitable, the self-adhesive repair flex circuit may be adhered to the circuit board and then the circuit board may be processed through the normal production flow of solder paste screening, component placement and reflow. This method of use provides an advantage of minimally disrupting the normal process flow, which is usually developed for high throughput and high quality at low cost.

Figure 5:
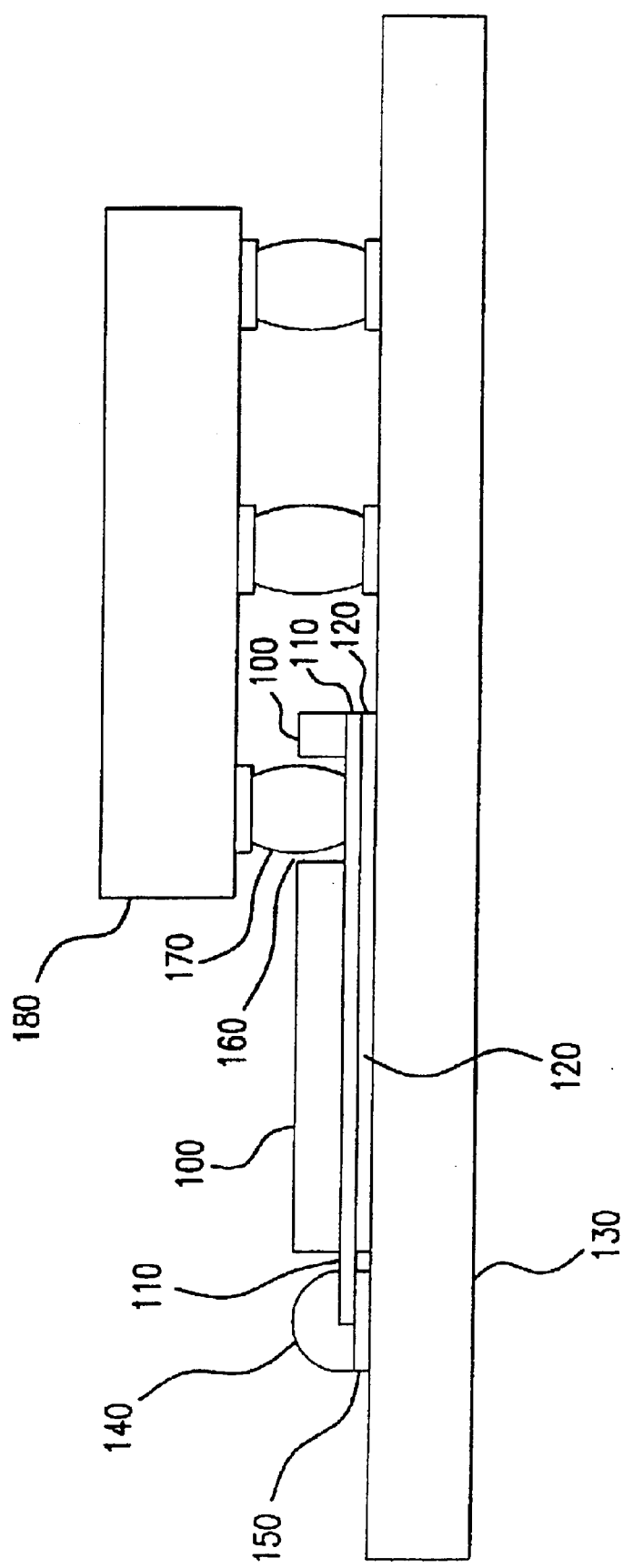
FIG. 5 is a side view of a BGA example use of a self-adhesive flex circuit according to the invention.

FIG. 5 shows a side view of a BGA example use of a self-adhesive flex circuit according to the invention. The carrier film 100 has a hole 160. A grid ball 170 from the BGA component 180 fits into the hole 160 and makes contact with the circuit trace 110. The circuit trace 110 is electrically attached to an electrical pad 150 at its other end. FIG. 5 shows the circuit trace 110 in direct contact with the pad 150. It is understood that direct contact is not needed where the attachment 140 is electrically conductive.

The invention provides a simple method of attaching a self-adhesive flex circuit to a circuit assembly. First, the self-adhesive flexible circuit is put into place on the circuit board. The self-adhesive flexible circuit is then adhered to the circuit board. Preferably, the self-adhesive flexible circuit is adhered to the circuit board by the application of pressure, thus activating the pressure sensitive adhesive. The use of a pressure sensitive adhesive allows movement of the flexible circuit until properly placed. The circuit traces are then electrically attached to electrical contacts. Where the circuit traces are attached to electrical pads, it is preferred that an electrically conductive solder is used. An electrically conductive adhesive can also be used. A ball grid array can also be place on the circuit board, making contact with the circuit trace via a hole, or holes in the carrier film.

While various embodiments of the present invention have been described above, it should be understood that they have been presented by way of example only, and not limitation. Thus, the breadth and the scope of the present invention are not limited by any of the above exemplary embodiments, but are defined only in accordance with the following claims and their equivalents.

What is claimed is:

1. A flexible circuit for repair of a printed circuit assembly, comprising:

a carrier film top layer, a circuit trace middle layer, where said circuit trace middle layer comprises at least one circuit trace, and an adhesion bottom layer, where said adhesion bottom layer is a pressure sensitive adhesive.

2. The flexible circuit of claim 1 where said carrier film top layer is polyimide laminate and where said pressure sensitive adhesive is an acrylic foam tape adhesive.

3. A flexible circuit for repairing defects in a circuit assembly on a printed circuit board, said flexible circuit comprising:

a carrier film having a predetermined shape, said carrier film comprising a rectangular shape having a fixed length, at least one circuit trace attached to said carrier film, where said at least one circuit trace has a proximal end and a distal end and a length greater than said fixed length and an adhesive applied to said circuit trace and said carrier film.

4. The flexible circuit of claim 3, where said proximal and distal ends are affixable to said printed circuit board.

5. The flexible circuit of claim 4, where said adhesive is a pressure sensitive adhesive.

* * * * *